(12) United States Patent
Glass et al.

(10) Patent No.: US 11,515,407 B2
(45) Date of Patent: Nov. 29, 2022

(54) HIGH BREAKDOWN VOLTAGE STRUCTURE FOR HIGH PERFORMANCE GAN-BASED HEMT AND MOS DEVICES TO ENABLE GAN C-MOS

(71) Applicant: Intel Corporation, Santa Clara, CA (US)

(72) Inventors: Glenn Glass, Portland, OR (US); Sansaptak Dasgupta, Hillsboro, OR (US); Han Wui Then, Portland, OR (US); Marko Radosavljevic, Portland, OR (US); Paul Fischer, Portland, OR (US); Anand Murthy, Portland, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 826 days.

(21) Appl. No.: 16/232,535

(22) Filed: Dec. 26, 2018

(65) Prior Publication Data

US 2020/0211842 A1 Jul. 2, 2020

(51) Int. Cl.
*H01L 29/778* (2006.01)
*H01L 21/02* (2006.01)
*H01L 29/20* (2006.01)
*H01L 29/205* (2006.01)
*H01L 27/092* (2006.01)
(Continued)

(52) U.S. Cl.
CPC ...... *H01L 29/7783* (2013.01); *H01L 21/0254* (2013.01); *H01L 21/02381* (2013.01); *H01L 21/02458* (2013.01); *H01L 21/02505* (2013.01); *H01L 21/30612* (2013.01); *H01L 21/8252* (2013.01); *H01L 23/562* (2013.01); *H01L 27/092* (2013.01); *H01L 29/2003* (2013.01);
(Continued)

(58) Field of Classification Search
None
See application file for complete search history.

(56) References Cited

U.S. PATENT DOCUMENTS 9,165,766 B2 * 10/2015 Keller ............... H01L 21/02381
9,202,905 B1 * 12/2015 Xie ..................... H01L 29/7783
(Continued)

OTHER PUBLICATIONS

Juncai et al. "Characteristics of AlGaN/GaN/AlGaN double heterojunction HEMTs with an improved breakdown voltage", 2012 J. Semicond., vol. 33, pp. 014002-1 to 014002-5. (Year: 2012).*
(Continued)

*Primary Examiner* — Scott B Geyer
(74) *Attorney, Agent, or Firm* — Schwabe, Williamson & Wyatt, P.C.

(57) ABSTRACT

An integrated circuit structure comprises a relaxed buffer stack that includes a channel region, wherein the relaxed buffer stack and the channel region include a group III-N semiconductor material, wherein the relaxed buffer stack comprises a plurality of AlGaN material layers and a buffer stack is located over over the plurality of AlGaN material layers, wherein the buffer stack comprises the group III-N semiconductor material and has a thickness of less than approximately 25 nm. A back barrier is in the relaxed buffer stack between the plurality of AlGaN material layers and the buffer stack, wherein the back barrier comprises an AlGaN material of approximately 2-10% Al. A polarization stack over the relaxed buffer stack.

23 Claims, 9 Drawing Sheets

(51) Int. Cl.
  *H01L 21/8252*  (2006.01)
  *H01L 29/66*  (2006.01)
  *H01L 21/306*  (2006.01)
  *H01L 23/00*  (2006.01)
(52) U.S. Cl.
  CPC ...... *H01L 29/205* (2013.01); *H01L 29/66462* (2013.01); *H01L 29/7787* (2013.01)

(56) References Cited

U.S. PATENT DOCUMENTS

| | | | | |
|---|---|---|---|---|
| 9,257,548 | B2* | 2/2016 | Takado | H01L 21/02579 |
| 10,636,899 | B2* | 4/2020 | Curatola | H01L 29/7783 |
| 2008/0258135 | A1* | 10/2008 | Hoke | H01L 29/201 |
| | | | | 257/E29.069 |
| 2009/0045438 | A1* | 2/2009 | Inoue | H01L 29/155 |
| | | | | 257/E29.091 |
| 2010/0289067 | A1* | 11/2010 | Mishra | H01L 21/02581 |
| | | | | 257/268 |
| 2011/0001127 | A1* | 1/2011 | Sakamoto | H01L 33/007 |
| | | | | 257/E21.09 |
| 2012/0025205 | A1* | 2/2012 | Nakata | H01L 29/7787 |
| | | | | 257/77 |
| 2012/0126239 | A1* | 5/2012 | Keller | H01L 21/0254 |
| | | | | 257/E29.089 |
| 2013/0016751 | A1* | 1/2013 | Takado | H01S 5/34333 |
| | | | | 372/45.01 |
| 2013/0026489 | A1* | 1/2013 | Gambin | H01L 29/66462 |
| | | | | 257/77 |
| 2014/0252366 | A1* | 9/2014 | Gao | H01L 29/7786 |
| | | | | 257/190 |
| 2015/0021660 | A1* | 1/2015 | Chen | H01L 29/66462 |
| | | | | 257/190 |
| 2015/0115327 | A1* | 4/2015 | Briere | H01L 29/66462 |
| | | | | 257/194 |
| 2016/0064488 | A1* | 3/2016 | Takado | H01L 29/205 |
| | | | | 257/20 |
| 2017/0033210 | A1* | 2/2017 | Curatola | H01L 29/7787 |
| 2017/0125562 | A1* | 5/2017 | Prechtl | H01L 29/42316 |
| 2017/0250273 | A1* | 8/2017 | Schultz | H01L 29/7783 |
| 2017/0373177 | A1* | 12/2017 | Benkhelifa | H01L 29/41758 |
| 2018/0138304 | A1* | 5/2018 | Curatola | H01L 29/7783 |

OTHER PUBLICATIONS

Zanandrea et al. "Single- and double-heterostructure GaN-HEMTs devices for power switching applications", Microelectronics Reliability 52 (2012) 2426-2430. (Year: 2012).*

* cited by examiner

HIGH BREAKDOWN VOLTAGE STRUCTURE FOR HIGH PERFORMANCE GAN-BASED HEMT AND MOS DEVICES TO ENABLE GAN C-MOS

TECHNICAL FIELD

Embodiments of the disclosure are in the field of integrated circuit structures and, in particular, a high breakdown voltage structure for a high performance GaN-based high electron mobility transistor (HEMT) and MOS devices to enable GaN C-MOS devices.

BACKGROUND

In the fields of wireless communication and power management, various components can be implemented using semiconductor devices such as transistors. For example, in radio frequency (RF) communication, the RF front end is a generic term for the circuitry between an antenna and a digital baseband system and the RF front end may include multiple transistor-based components, such as switches and amplifiers, to name some examples. Semiconductor devices are electronic components that exploit the electronic properties of semiconductor materials, such as silicon (Si), germanium (Ge), and gallium arsenide (GaAs), to name a few examples. A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow from the source to the drain. Some FETs have a fourth terminal called, the body or substrate, which can be used to bias the transistor.

One promising transistor technology for future RF products including in 5G is based on group III-nitrides (III-N), such as gallium nitride (GaN). However, this transistor technology faces limitations with respect to low breakdown voltage and high sheet resistance. Another consideration is that integration of p-MOS and n-MOS transistors to create a complementary MOS or complementary HEMT ensemble of devices remains challenging.

DESCRIPTION OF THE EMBODIMENTS

A high breakdown voltage structure for a high GaN-based HEMT and MOS devices to enable GaN C-MOS devices are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

One or more embodiments described herein are directed to structures and architectures for fabricating high performance III-N, such as gallium nitride (GaN), high electron mobility transistor (HEMT) and MOS devices having high breakdown voltages to enable GaN C-MOS devices. According to the disclosed embodiments, a majority of GaN in a thick buffer stack under a polarization stack is replaced with a back barrier comprising dilute AlGaN to increase breakdown voltage. In addition, the introduction of Al to the back barrier increases band gap and hence, the resistivity of the buffer stack. The back barrier with dilute AlGaN also enables the ability to use the same stack to produce both n- and p-type devices for a fully integrated C-MOS circuit. Embodiments may include or pertain to one or more of III-N transistors, GaN transistors, polarization layers, and systemon-chip (SoC) technologies. One or more embodiments may be implemented to realize high performance RF switch applications and power devices of future technology nodes. Design and manufacture (e.g., forming) of such devices may include transistors or transistor layers (e.g., layers of material that are included in or part of a transistor) of a GaN channel metal oxide semiconductor (MOS) devices. An example of such a device may be a GaN MOS-high electron mobility transistor (HEMT).

Figure 1:
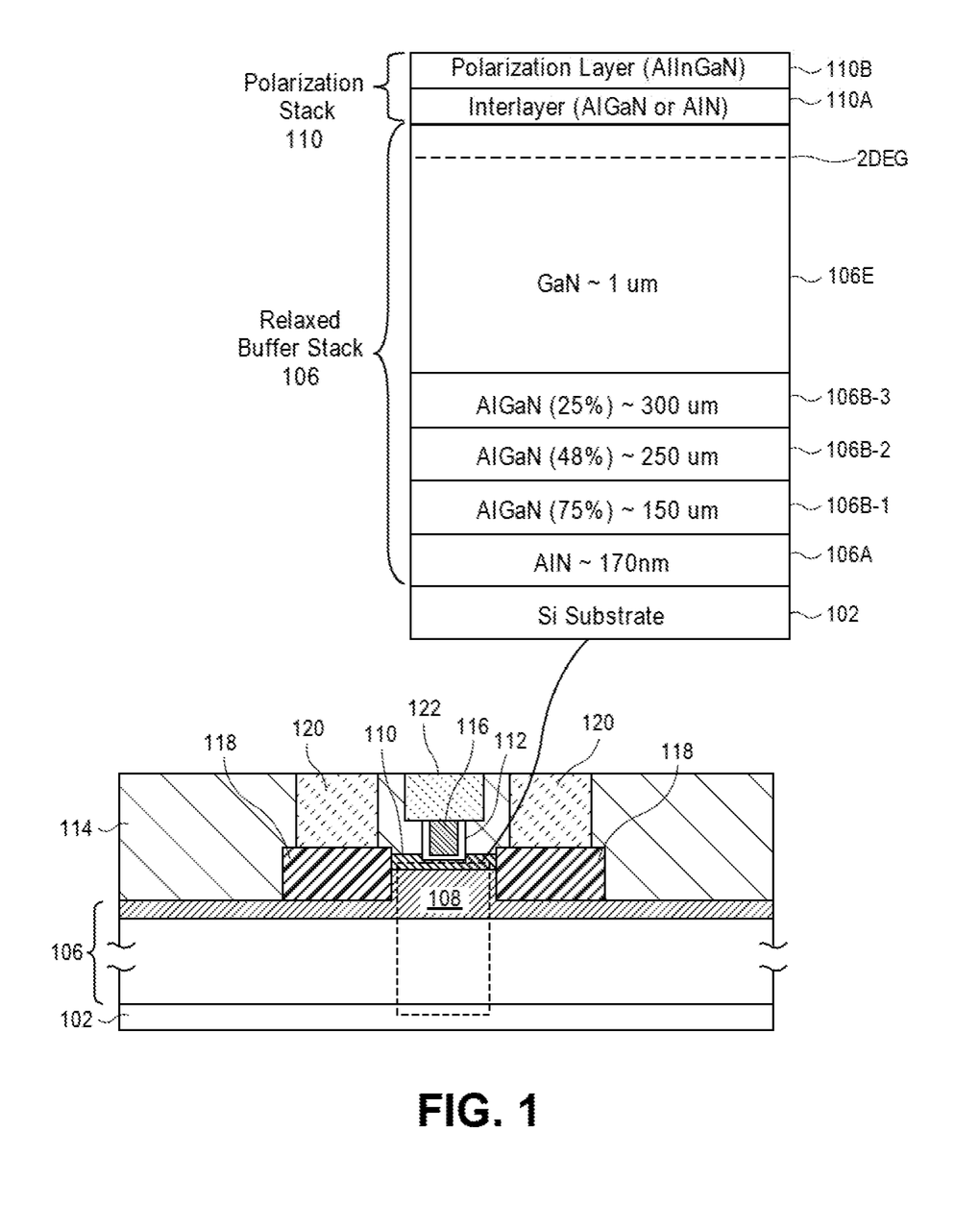
FIG. 1 is a cross-sectional view illustrating an integrated circuit structure comprising a III-N material, such as gallium nitride (GaN) channel-based transistor.

To provide context, FIG. 1 is a cross-sectional view illustrating an integrated circuit structure comprising a III-N material, such as gallium nitride (GaN) channel-based transistor 100. FIG. 1 is for illustrative purposes only and is not drawn to scale. The transistor 100 includes a base substrate 102 and a relaxed buffer stack 106 over the substrate. The relaxed buffer stack 106 forms a channel region 108 of the transistor 100, and over the relaxed buffer stack 106 is an epitaxially grown polarization stack 110. Source/drain regions 118 are formed adjacent to opposite sides of the polarization stack 110 and the channel region 108. A gate dielectric layer 112, such as silicon dioxide and/or high-k dielectric material and a gate electrode 116 are over the polarization stack 110. Gate electrode 116 may include any suitable material, such as polysilicon, silicon nitride, silicon carbide, and/or various suitable metal material, such as aluminum (Al), tungsten (W), titanium (Ti), tantalum (Ta), copper (Cu), titanium nitride (TiN), or tantalum nitride (TaN), for example. The transistor 100 further includes source/drain contacts 120 and a gate contact 122 formed through an insulating layer 114 and in contact with the source/drain regions 118 and the gate electrode 116, respectively.

The enlarged view of the relaxed buffer stack 106 and polarization stack 110 shows that in a typical embodiment, the relaxed buffer stack 106 may include a bottom AlN material layer 106A on the substrate 102, and multiple AlGaN material layers including a first AlGaN material layer 106B-1 on the AlN material layer 106A, a second AlGaN material layer 106B-2 on the first AlGaN material layer 106B-1, and a third AlGaN material layer 106B-3 on the second AlGaN material layer 106B-2. The relaxed buffer stack 106 further includes a GaN layer 106E on the top of third AlGaN material layer 106B-3.

In one embodiment, the bottom AlN material layer 106A may be approximately 170 nm in thickness. In one embodiment, the first AlGaN material layer 106B-1 may comprise approximately 75% Al and may be approximately 150 nm in thickness. In one embodiment, the second AlGaN material layer 106B-2 may comprise approximately 48% Al and may be approximately 250 nm in thickness. In one embodiment, the third AlGaN material layer 106B-3 may comprise approximately 25% Al and may be approximately 300 nm in thickness. In one embodiment, the buffer stack may be approximately 1 um in thickness.

The polarization stack 110 may include an interlayer 110A comprising AlN, and a polarization layer 110B comprising AlInGaN, for example. In one embodiment, the interlayer 110A may be approximately 1 nm in thickness. One purpose of the polarization stack 110 is to increase carrier mobility in the transistor channel region 108 and/or be used to form a two-dimensional electron gas (2 DEG) configuration at the interface between the interlayer 110A and the buffer stack 106E (as shown by the dashed line).

Group III nitride transistors are potential candidates for future RF products, such as in 5G. In order to enable higher performance, GaN transistors fabricated on a Si substrate require the elaborate and thick buffer stack 106E to reduce threading dislocation density (TDD) and to control stress and hence wafer bow. In addition, low breakdown voltage is a major limiter for the high-voltage operation of the indium containing polarization stack 110 due to the tendency of the indium to oxidize coupled with the conductive nature of that oxide. An alternative is to use an AlGaN interlayer 110A in the polarization stack 110, but such a polarization stack results in higher 2 DEG sheet resistance.

Figure 2:
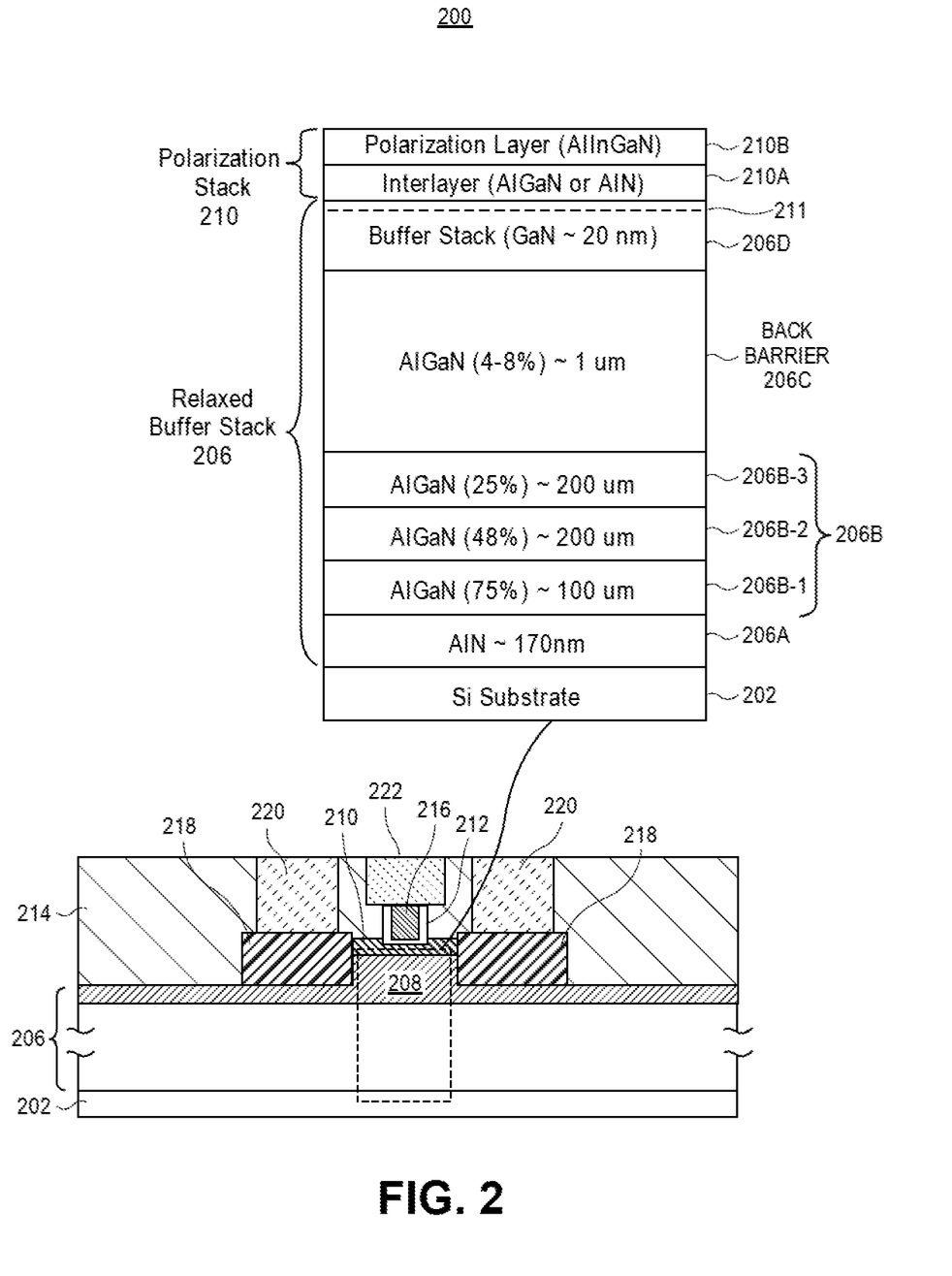
FIG. 2 is a cross-sectional view illustrating an integrated circuit structure comprising a III-N semiconductor material, such as a GaN channel-based MOS device with an improved relaxed buffer stack to increase breakdown voltage in accordance with one embodiment.

FIG. 2 is a cross-sectional view illustrating an integrated circuit structure comprising a III-N semiconductor material, such as a GaN channel-based MOS device 200 with an improved relaxed buffer stack to increase breakdown voltage in accordance with one embodiment. FIG. 2 is for illustrative purposes only and is not drawn to scale.

In one embodiment, the MOS device 200 may be used as a field-effect transistor (FET) in various components of an RF front end of a mobile device RF and/or RF base stations. The MOS device 200 includes a relaxed buffer stack 206 over an optional substrate 202 and a polarization stack 210 over the relaxed buffer stack 206. In this example embodiment, relaxed buffer stack 206 forms a channel region 208 of the MOS device 200. Source/drain (S/D) regions 218 are formed adjacent to opposite sides of the polarization stack 210 and the channel region 208. A gate dielectric layer 212, such as silicon dioxide and/or high-k dielectric material and a gate electrode 216 are over the polarization stack 210. Gate electrode 216 may include any suitable material, such as polysilicon, silicon nitrogen, silicon carbide, and/or various suitable metal material, such as aluminum (Al), tungsten (W), titanium (Ti), tantalum (Ta), copper (Cu), titanium nitride (TiN), or tantalum nitride (TaN), for example. The MOS device 200 further includes source/drain contacts 220 and a gate contact 222 formed through an insulating layer 214 and in contact with the source/drain regions 218 and the gate electrode 216, respectively.

Substrate 202 is optional because in some embodiments, the relaxed buffer stack 206 may be a bulk wafer, such that the relaxed buffer stack 206 is not formed above or on another material substrate but is instead used as the substrate itself, for example. However, in the example stack of layers shown in FIG. 2, substrate 202 is present and relaxed buffer stack 206 is formed above substrate 202. Substrate 202, in some embodiments, may include a bulk substrate including a group IV material, such as silicon (Si), germanium (Ge), SiGe, or silicon carbide (SiC), and/or at least one group III-V material and/or sapphire and/or any other suitable material(s).

In some embodiments, an optional buffer layer (not shown) may be located between the relaxed buffer stack 206 and the substrate 202 when present. In the case where or buffer layer is a III-V material and formed on the substrate 202 that is a non-III-V material (e.g., Si, Ge, SiGe, SiC, or sapphire substrate), the buffer layer may act to improve growth conditions and/or prevent the III-V relaxed buffer stack 206 from reacting with the non-III-V substrate material.

An enlarged view of the relaxed buffer stack 206 and polarization stack 210 is shown. In one embodiment, the relaxed buffer stack 206 may include a bottom AlN material layer 206A on optional substrate 202, a plurality of AlGaN material layers 206B over the bottom AlN material layer 206A, and a buffer stack 206D over the plurality of AlGaN material layers 206B.

According to the disclosed embodiments, rather than a thick 1 um GaN buffer stack 106E under a polarization stack as shown in FIG. 1, a majority of GaN in the thick GaN buffer stack is replaced with a back barrier 206C between the plurality of AlGaN material layers 206B and the buffer stack 206D, where the back barrier 206C comprises a dilute AlGaN material of approximately 2-10% Al to increase breakdown voltage. In one embodiment, the back barrier 206C may be approximately 0.75-1.25 um in thickness, or in an embodiment 1 um, where thickness may be tuned to the thickness of the buffer stack 206D.

Accordingly, the disclosed embodiments use a higher bandgap (compared to GaN) material as a back barrier 206C so that the layers on top of the layer stack do not short or arc down to the substrate as resistivity of the relaxed buffer stack 206 is increased. Due to the presence of the back barrier 206C, the thickness of the buffer stack 206D may be reduced to less than approximately 25 nm. In another embodiment, the thickness of the relaxed buffer stack 206 may be reduced to less than approximately 20 nm.

In one embodiment, the plurality of AlGaN material comprise at least three layers. For example, in one embodiment, the multiple AlGaN material layers may include a first AlGaN material layer 206B-1 on the bottom AlN material layer 206A, a second AlGaN material layer 206B-2 on the first AlGaN material layer 206B-1, and a third AlGaN material layer 206B-3 on the second AlGaN material layer 206B-2.

In one embodiment, the bottom AlN material layer 206A may be approximately 145-105 nm in thickness and preferably 175 nm. In one embodiment, the plurality of AlGaN material layers 206B each have a thickness less than approximately 250 nm. For example, the first AlGaN material layer 206B-1 may be approximately 75-125 nm in thickness and preferably 100 nm. The second AlGaN material layer 206B-2 may be approximately 175-225 nm in thickness, and preferably 200 nm. The third AlGaN material layer 206B-3 may be approximately 175-225 nm in thickness, and preferably 200 nm.

In one embodiment, the plurality of AlGaN material layers 206B each have a decreasing percentage of Al from a bottom one of the plurality of AlGaN material layers to a top one of the plurality of AlGaN material layers. For example, the first AlGaN material layer 206B-1 may comprise approximately 75% Al, the second AlGaN material layer 206B-2 may comprise approximately 48% Al, and the third AlGaN material layer 206B-3 may comprise approximately 25% Al. These AlGaN layers may be subdivided in any arbitrary fashion. FIG. 2 merely shows an example of a generally graded set of layers from majority Al to majority Ga. Polarization stack 210, in some embodiments, may be formed using any suitable techniques, as will be apparent in light of the present disclosure. In some embodiments, polarization stack 210 may include any suitable materials, such as one or more III-V materials, and more specifically in some embodiments, one or more III-N materials, for example. The polarization stack 210 may include an interlayer 210A, and a polarization layer 210B over the interlayer 210A, for example. In some embodiments, the polarization stack 210 may include aluminum and nitrogen, such that one or more of the interlayer 210B and the polarization layer 210B comprise at least one of AlN, AlGaN, and AlInGaN, for instance. For example, in the embodiment where the relaxed buffer stack 206 comprises a III-N semiconductor material, such as GaN, the interlayer 210A may comprise a material such as AlGaN or AlN, and a polarization layer 210B may comprise AlInGaN.

One purpose of the polarization stack 210 is to increase carrier mobility in the transistor channel region 208 and/or be used to form a two-dimensional electron gas (2 DEG) configuration 211 in the GaN buffer layer 206D just below the interface between the interlayer 210A and the buffer stack 206D (as shown by the dashed line). When the MOS device 200 is in an ON state (as indicated in FIG. 2), the 2 DEG configurations 211 along with channel region 208 allow charge carriers (e.g., electrons or holes) to flow from one source/drain (S/D) region 218 to the other, depending on the end use or target application. In some cases, the thickness and/or composition of polarization stack 210 may affect the magnitude of a polarization vector formed, and thus the amount of charge (and corresponding conductivity) in the 2 DEG configurations 211. In one embodiment, the interlayer 210A may be approximately 1 nm in thickness.

Source and drain (S/D) regions 218, in some embodiments, may be formed using any suitable techniques, depending on the end use or target application. As shown in the example structure of FIG. 2, S/D regions 218 are grown (or regrown) from polarization stack 210 as that layer may have provided a relatively high-quality growth surface, particularly where the S/D regions 218 include III-V material, for example. However, any suitable techniques may have been used to form S/D regions 218. In some embodiments, S/D regions 218 may include any suitable material and any suitable doping scheme, such as being n-type doped using appropriate techniques and materials based on the S/D material and depending on the end use or target application. For example, where relaxed buffer stack 206 includes III-V material, such as GaN or InGaN, S/D regions 218 may both be n-type Si doped GaN, InN or InGaN. In some embodiments, S/D regions 218 may have a multi-layer structure including multiple material layers. For instance, in some embodiments, a passivation material may be deposited prior to the deposition of the primary S/D material to assist with the quality of the interface between the S/D regions 218 and the relaxed buffer stack 206 material. Further, in some embodiments, a contact-improving material may be formed on the top of the S/D regions 218 to assist with making contact to S/D regions 218 and S/D contacts 220 and gate contact 222 (described below). For example. In another example embodiment, where the transistor device is configured to be a PMOS device in contact with a 2DHG, S/D regions 218 may contain p-type doping such as Mg, Zn, Cd, Li and the like at less than 1E21 atoms/cm$^3$ and the like doped GaN, InAs, InSb or other suitable material. In some embodiments, S/D regions 218 may include grading (e.g., increasing and/or decreasing) the content of one or more materials in at least a portion of the regions.

S/D regions 218 and S/D contacts 220 and gate contact 222, in some embodiments, may be formed using any suitable techniques, depending on the end use or target application. In some embodiments, S/D regions 218 and S/D contacts 220 and gate contact 222 may include any suitable material, such as a conductive metal or alloy (e.g., aluminum, tungsten, silver, titanium, nickel-platinum, or nickel-aluminum). In some embodiments, S/D regions 218 and S/D contacts 220 and gate contact 222 may include a resistance reducing metal and a contact plug metal, or just a contact plug, depending on the end use or target application. Example contact resistance reducing metals may include silver, nickel, aluminum, titanium, gold, gold-germanium, nickel-platinum, or nickel aluminum, and/or other such resistance reducing metals or alloys. The contact plug metal may include, for instance, aluminum, silver, nickel, platinum, titanium, or tungsten, or alloys thereof, although any suitably conductive contact metal or alloy can be used, depending on the end use or target application. In some embodiments, additional layers may be present in the S/D contacts 220, such as adhesion layers (e.g., titanium nitride)

and/or liner or barrier layers (e.g., tantalum nitride), if so desired. In some embodiments, metallization of the S/D regions 218 and S/D contacts 220 and gate contact 222 may be carried out, for example, using an alloying analogous to silicon technologysilicidation, or germanidation process euphemistically called III-Vidation (e.g., generally, deposition of contact metal followed by annealing). Numerous S/D configurations will be apparent in light of this disclosure.

A process for fabricating transistor layers of GaN channel-based MOS devices having a back barrier that acts as a high breakdown voltage structure to increase breakdown voltage and to enable GaN C-MOS will now be described. The process may begin by forming a relaxed buffer stack 206 that includes a channel region 208, wherein the relaxed buffer stack 206 and the channel region 208 include a group III-N semiconductor material, wherein the relaxed buffer stack 206 comprises a plurality of AlGaN material layers and a buffer stack 206D over the plurality of AlGaN material layers, wherein the buffer stack 206D comprises the group III-N semiconductor material and has a thickness of less than approximately 25 nm. A back barrier 206C is formed in the relaxed buffer stack between the plurality of AlGaN material layers and the buffer stack 206D, wherein the back barrier 206C comprises an AlGaN material of approximately 2-10% Al. A polarization stack is then formed over the relaxed buffer stack 206 to form n-type devices that include a 2 DEG configuration 211.

Such GaN-based MOS devices are most commonly used as n-type unipolar devices, which can be limiting, as it is desirable is to also use the transistors in CMOS mode. Accordingly, a further aspect of the disclosed embodiments is to use the relaxed buffer stack 206 having a back barrier 206C with dilute AlGaN in a manner that also enables fabrication of p-type devices to provide fully integrated CMOS circuitry, as described in FIG. 3.

Figure 3:
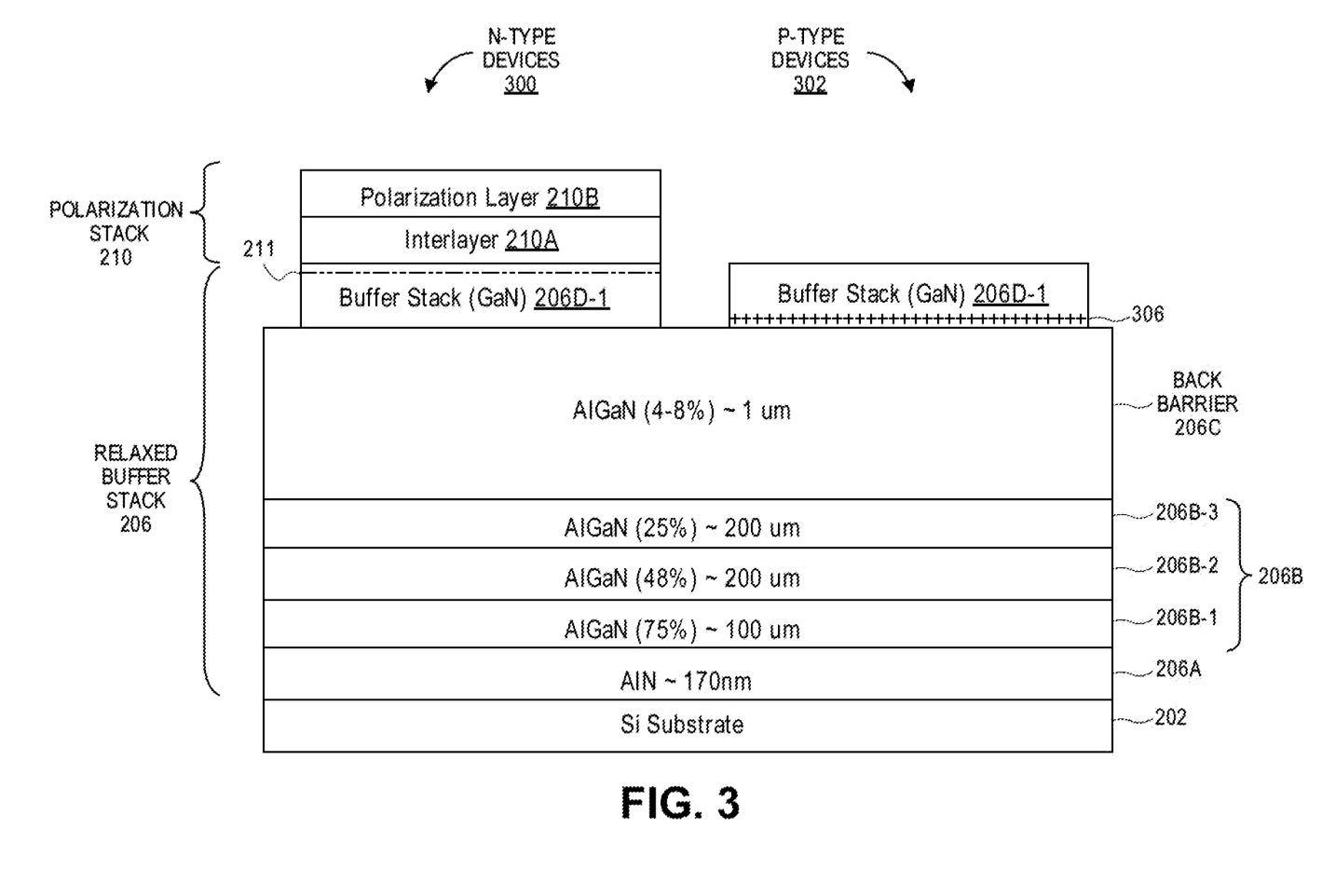
FIG. 3 illustrates a cross sectional view of a portion of a transistor layers of GaN channel-based devices, including the relaxed buffer stack having a back barrier with dilute AlGaN to enable fabrication of both n-type devices and p-type devices on the same substrate.

FIG. 3 illustrates a cross sectional view of a portion of a transistor layers of GaN channel-based devices, including the relaxed buffer stack 206 having a back barrier 206C with dilute AlGaN to enable fabrication of both n-type devices and p-type devices on the same substrate 202.

After forming a relaxed buffer stack 206 and the polarization stack 210 over the buffer stack 206D-1, shallow trench isolation (STI) is performed on the polarization stack 210 and the buffer stack 206D-1 down to the back barrier 206C to form source/drain trenches to form a plurality of device stacks comprising the polarization stack 210 and the GaN buffer stack 206D-1 that define both n-type and p-type device locations. Thereafter, n-type devices 300 are formed on or around the device stacks in the n-type device locations, where the n-type devices 300 include a 2 DEG configuration 211.

The polarization stack 210 is then etched away from the device stacks over the device locations intended for p-type devices 302. In contrast to the n-type devices, the p-type devices include 2DHG configurations 306 at the interface of the GaN buffer stack 206D-1 and the back barrier 206C to act as a polarization layer for the back barrier 206C.

Figure 4:
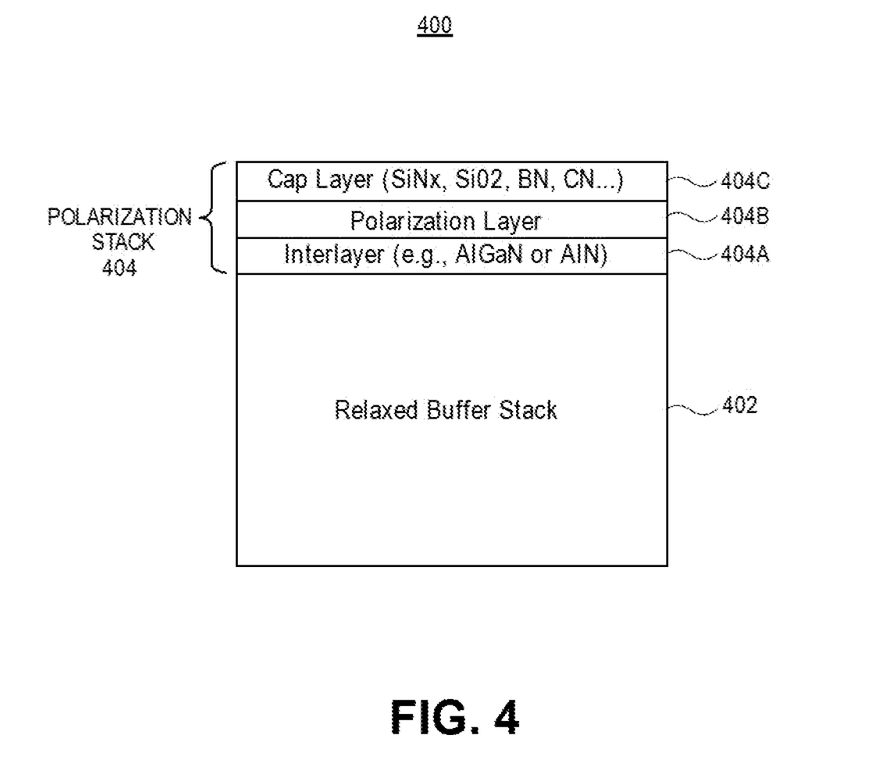
FIG. 4 is a cross-sectional view of a layer stack according to a further aspect of the disclosed embodiments.

FIG. 4 is a cross-sectional view of a layer stack according to a further aspect of the disclosed embodiments. The layer stack 400 is similar to the embodiments described above in that the layer stack 400 includes a relaxed buffer stack 402 and a polarization stack 404 over the relaxed buffer stack 402, and where the polarization stack 404 includes an interlayer 404A and a polarization layer 404B. According to a further embodiment, however, layer stack 400 further includes an additional cap layer 404C on the top of polarization stack 404 for passivation. The presence of this cap layer stack 404C reduces, if not prevents, degradation of the polarization layer 404B during subsequent device processing steps and acts like a "protective" cap for the 2 DEG. In one embodiment, the cap layer 404C may comprise any of $SiN_x$, $SiO_2$, or other insulating metal oxide or nitride, such as BN and CN, and the like. In this embodiment, the polarization layer 404B may comprise InAlN, AlGaN or InAlGaN, where the concentration of In is less than 25 percent of the group III elemental composition. In one embodiment, the cap layer 404C may have thickness range of approximately 1-20 nm.

FIGS. 5A-5D illustrate various enhancement and depletion mode embodiments for a GaN-based n-MOS device having an improved relaxed buffer stack 206; and FIGS. 5E-5H illustrate various enhancement and depletion mode embodiments for a GaN-based p-MOS device having an improved relaxed buffer stack 206.

Figure 5A:
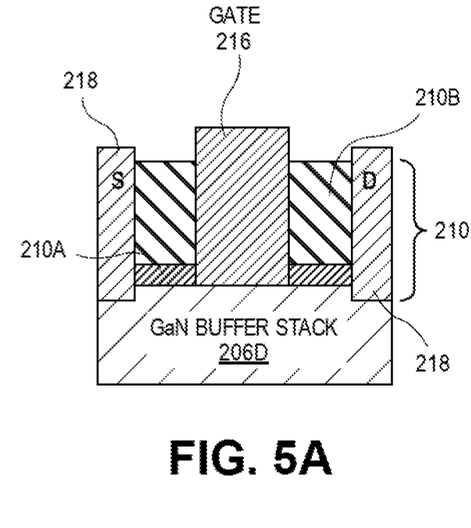
FIGS. 5A-5D illustrate various enhancement and depletion mode embodiments for a GaN-based n-MOS device having an improved relaxed buffer stack.

Referring now to FIG. 5A, the channel region of a GaN-based n-MOS device is shown implemented as an enhancement mode device. In this embodiment, polarization stack 210 (comprising the interlayer 210A and the polarization layer 210B) is over the GaN buffer stack 206D of the relaxed buffer stack 206 (not shown). Source/drain (S/D) regions 218 are formed adjacent to opposite sides of the polarization stack 210. In one embodiment, the source/drain regions 218 may be regrown Si doped with GaN or other suitable n-type material. A gate electrode 216 and optional gate dielectric layer 212 (not shown) are located through a portion of the polarization stack 210 and on the GaN buffer stack 206D, which is the GaN layer of the relaxed buffer stack 206.

Figure 5B:
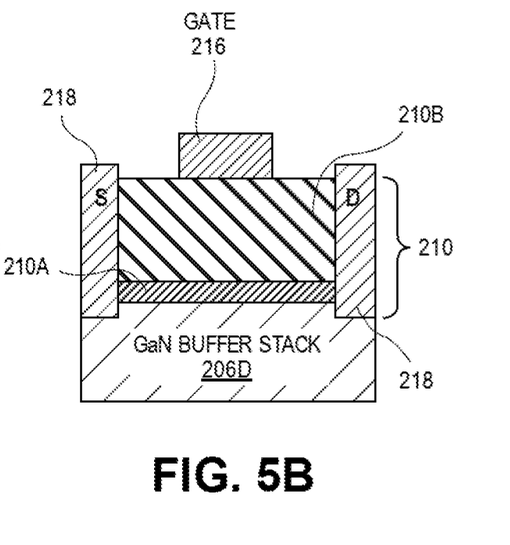

FIG. 5B shows the channel region of a GaN-based n-MOS device implemented as a depletion mode device. This embodiment is similar to the enhancement mode implementation of FIG. 5A except that in depletion mode, the gate electrode 216 and optional gate dielectric layer 212 (not shown) are located on the polarization stack 210, rather than through the polarization stack 210.

Figure 5C:
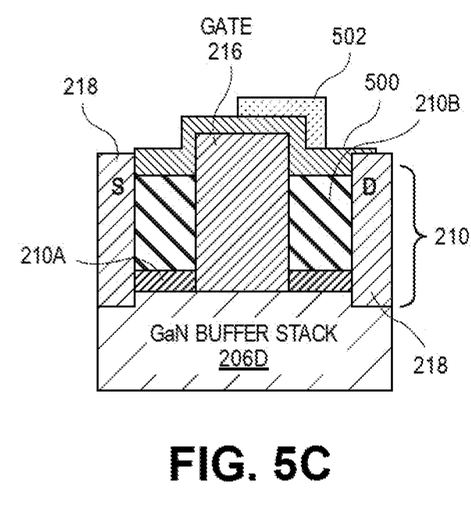

FIG. 5C shows the channel region of a GaN-based n-MOS device implemented as an enhancement mode device incorporating a field plate. This embodiment is similar to the enhancement mode implementation of FIG. 5A except that an insulator 500 is formed conformally on the polarization stack 210 and the gate electrode 216 in contact with the source/drain regions 218, and metal field plate 502 is formed partially on the insulator 500, as shown.

Figure 5D:
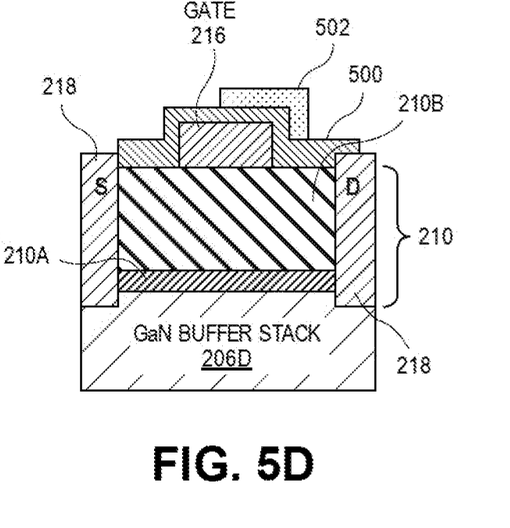

FIG. 5D shows the channel region of a GaN-based n-MOS device implemented as a depletion mode device incorporating a field plate. This embodiment is similar to the enhancement mode implementation of FIG. 5B except that an insulator 500 is formed conformally on the polarization stack 210 and the gate electrode 216 in contact with the source/drain regions 218, and metal field plate 502 is formed partially on the insulator 500, as shown.

Figure 5E:
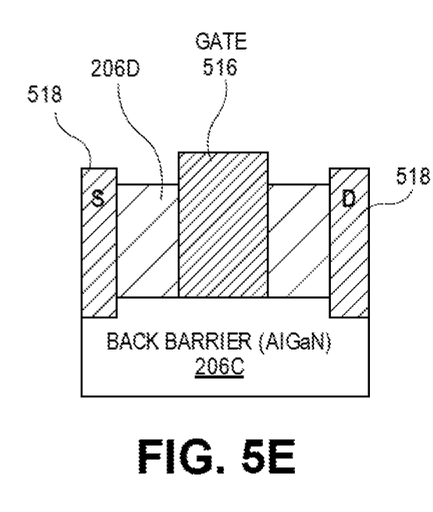
FIGS. 5E-5H illustrate various enhancement and depletion mode embodiments for a GaN-based p-MOS device having an improved relaxed buffer stack.

Referring now to FIG. 5E, the channel region of a GaN-based p-MOS device is shown implemented as an enhancement mode device. In this embodiment, the top of the p-MOS region is shown, which comprises the GaN buffer stack 206D over the InGaN back barrier 206C of the relaxed buffer stack 206 (not shown in entirety). Source/drain (S/D) regions 518 are formed adjacent to opposite sides of the GaN buffer stack 206D. In one embodiment, the source/drain regions 518 may be regrown Mg, Zn and like doped with GaN or other suitable p-type material. A gate electrode 516 and optional gate dielectric layer (not shown) are located through a portion of the GaN buffer stack 206D and on the InGaN back barrier 206C.

Figure 5F:
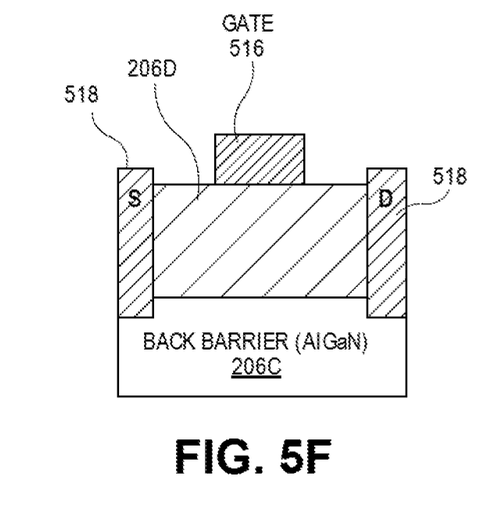

FIG. 5F shows the channel region of a GaN-based p-MOS device implemented as a depletion mode device. This embodiment is similar to the enhancement mode implementation of FIG. 5E except that in depletion mode, the gate electrode 516 and optional gate dielectric layer (not shown) are located on the GaN buffer stack 206D, rather than through the GaN buffer stack 206D.

Figure 5G:
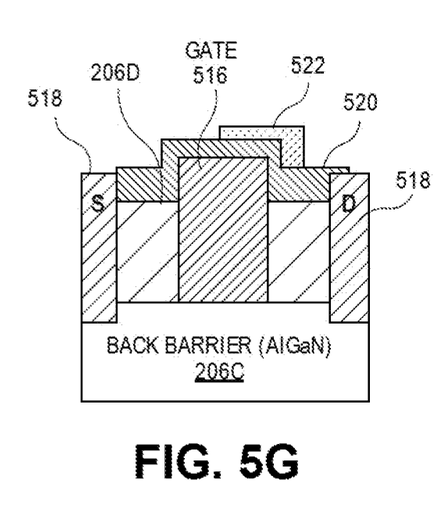

FIG. 5G shows the channel region of a GaN-based p-MOS device implemented as an enhancement mode device incorporating a field plate. This embodiment is similar to the enhancement mode implementation of FIG. 5E except that an insulator 520 is formed conformally on the GaN buffer stack 206D and the gate electrode 516 in contact with the source/drain regions 518, and metal field plate 522 is formed partially on the insulator 520, as shown.

Figure 5H:
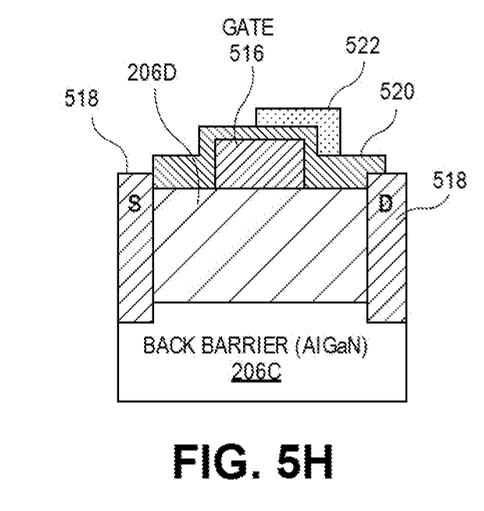

FIG. 5H shows the channel region of a GaN-based p-MOS device implemented as a depletion mode device incorporating a field plate. This embodiment is similar to the enhancement mode implementation of FIG. 5F except that an insulator 520 is formed conformally on the GaN buffer stack 206D and the gate electrode 516 in contact with the source/drain regions 518, and metal field plate 522 is formed partially on the insulator 520, as shown.

The structures of FIGS. 2 through 5H are primarily depicted and described herein in the context of a planar FET configuration. However, in some embodiments, other transistor configurations can benefit from the techniques described herein. For example, the techniques may be used to form transistors having non-planar configurations, such as finned or finFET configurations (e.g., including a dual-gate or tri-gate configuration) or gate-all-around configurations (e.g., including one or more nanowires or nanoribbons). Further, in some embodiments, the techniques can be used to form numerous different types of transistors, such as MOSFETs, tunnel-FETs (TFETs), high-electron-mobility transistors (HEMTs), or other suitable transistor architectures, depending on the end use or target application. Further yet, in some embodiments, the techniques can be used to form integrated circuits including p-channel and/or n-channel transistor devices, such as p-channel MOSFET (PMOS), n-channel MOSFET (NMOS), p-channel TFET (PTFET), n-channel TFET (NTFET), p-channel HEMT (PHEMT), and/or n-channel HEMT (NHEMT), to name some examples. Further still, in some embodiments, the techniques may be used to benefit either or both of p-channel and n-channel transistors included in complementary MOS (CMOS) or complementary TFET (CTFET) devices, for example. In some embodiments, the techniques may be used to benefit devices of varying scales, such as transistor devices having critical dimensions in the micrometer range or in the nanometer range (e.g., transistors formed at the 32, 22, 14, 10, 7, or 5 nm process nodes, or beyond).

The integrated circuit structures described herein may be included in an electronic device. As an example of one such apparatus, FIGS. 6A and 6B are top views of a wafer and dies that include one or more GaN channel-based MOS devices with a back barrier to increase breakdown voltage and to enable GaN C-MOS, in accordance with one or more of the embodiments disclosed herein.

Figure 6A:
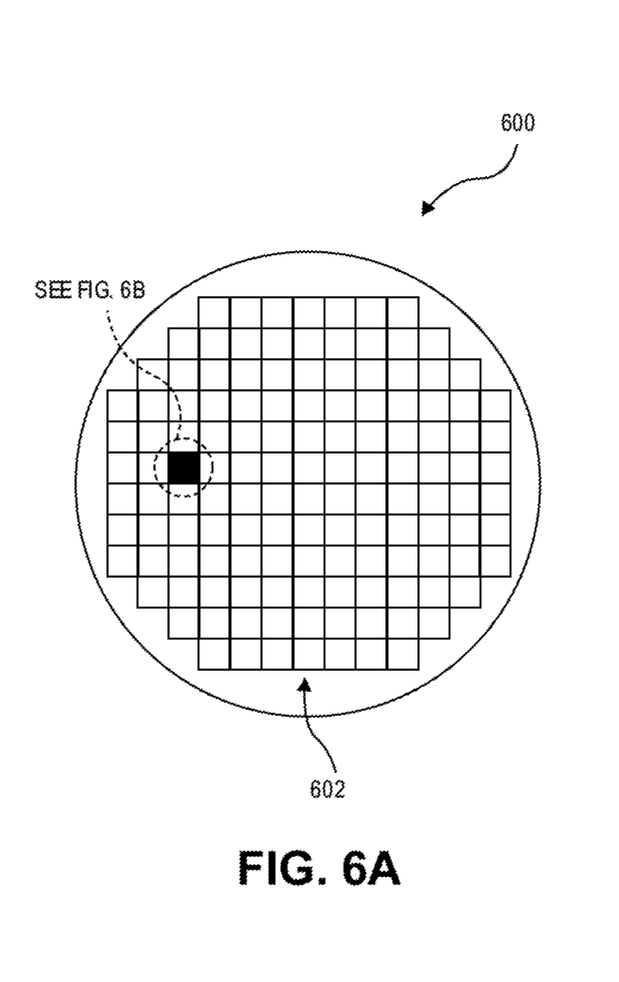
FIGS. 6A and 6B are top views of a wafer and dies that include one or more GaN channel-based MOS devices with a back barrier to increase breakdown voltage and to enable GaN C-MOS, in accordance with one or more of the embodiments disclosed herein.
Figure 6B:
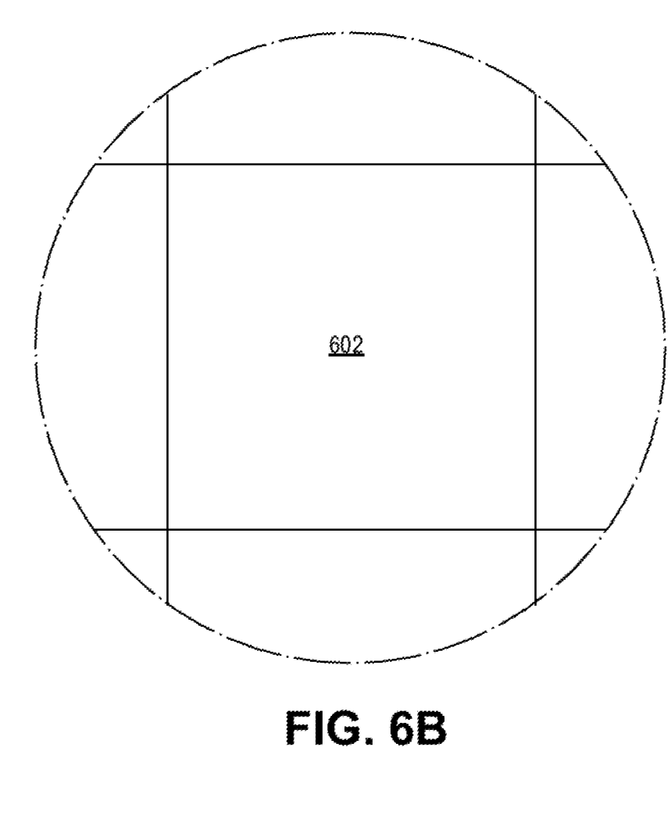

Referring to FIGS. 6A and 6B, a wafer 600 may be composed of semiconductor material and may include one or more dies 602 having integrated circuit (IC) structures formed on a surface of the wafer 600. Each of the dies 602 may be a repeating unit of a semiconductor product that includes any suitable IC (e.g., ICs including one or more GaN channel-based MOS devices with a back barrier to increase breakdown voltage and to enable GaN C-MOS, such as described above. After the fabrication of the semiconductor product is complete, the wafer 600 may undergo a singulation process in which each of the dies 602 is separated from one another to provide discrete "chips" of the semiconductor product. In particular, structures that include embedded non-volatile memory structures having an independently scaled selector as disclosed herein may take the form of the wafer 600 (e.g., not singulated) or the form of the die 602 (e.g., singulated). The die 602 may include one or more embedded non-volatile memory structures based independently scaled selectors and/or supporting circuitry to route electrical signals, as well as any other IC components. In some embodiments, the wafer 600 or the die 602 may include an additional memory device (e.g., a static random access memory (SRAM) device), a logic device (e.g., an AND, OR, NAND, or NOR gate), or any other suitable circuit element. Multiple ones of these devices may be combined on a single die 602. For example, a memory array formed by multiple memory devices may be formed on a same die 602 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
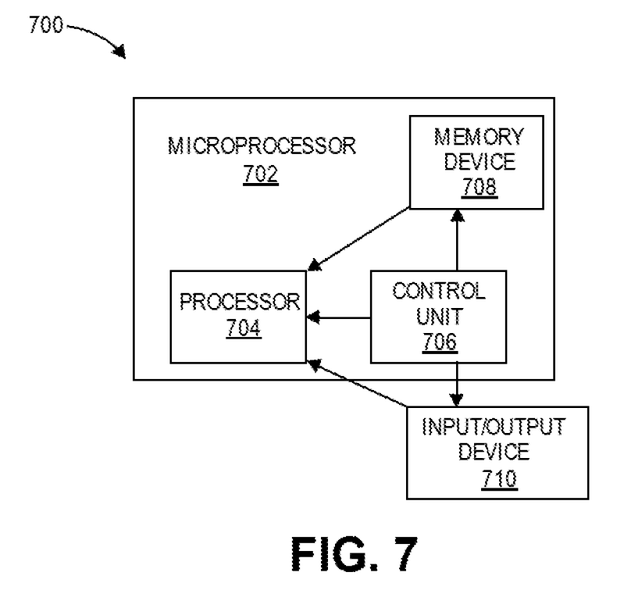
FIG. 7 illustrates a block diagram of an electronic system, in accordance with an embodiment of the present disclosure.

FIG. 7 illustrates a block diagram of an electronic system 700, in accordance with an embodiment of the present disclosure. The electronic system 700 can correspond to, for example, a portable system, a computer system, a process control system, or any other system that utilizes a processor and an associated memory. The electronic system 700 may include a microprocessor 702 (having a processor 704 and control unit 706), a memory device 708, and an input/output device 710 (it is to be appreciated that the electronic system 700 may have a plurality of processors, control units, memory device units and/or input/output devices in various embodiments). In one embodiment, the electronic system 700 has a set of instructions that define operations which are to be performed on data by the processor 704, as well as, other transactions between the processor 704, the memory device 708, and the input/output device 710. The control unit 706 coordinates the operations of the processor 704, the memory device 708 and the input/output device 710 by cycling through a set of operations that cause instructions to be retrieved from the memory device 708 and executed. The memory device 708 can include a non-volatile memory cell as described in the present description. In an embodiment, the memory device 708 is embedded in the microprocessor 702, as depicted in FIG. 7. In an embodiment, the processor 704, or another component of electronic system 700, includes one or more GaN channel-based MOS devices with a back barrier to increase breakdown voltage and to enable GaN C-MOS, such as those described herein.

Figure 8:
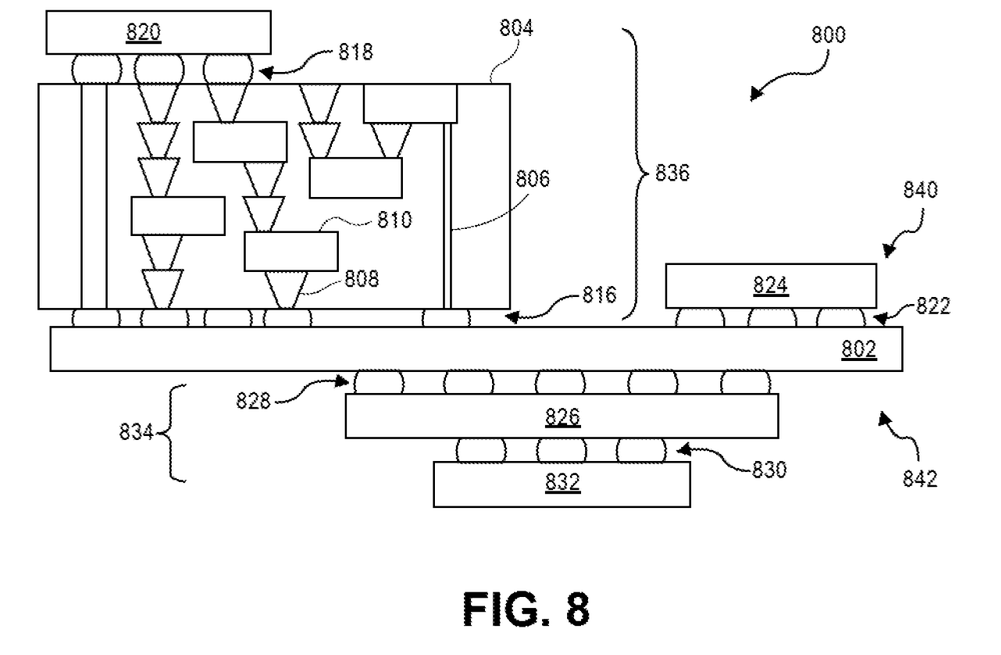
FIG. 8 is a cross-sectional side view of an integrated circuit (IC) device assembly that may include one or more GaN channel-based MOS devices with a back barrier to increase breakdown voltage and to enable GaN C-MOS, in accordance with one or more of the embodiments disclosed herein.

FIG. 8 is a cross-sectional side view of an integrated circuit (IC) device assembly that may include one or more GaN channel-based MOS devices with a back barrier to increase breakdown voltage and to enable GaN C-MOS, in accordance with one or more of the embodiments disclosed herein.

Referring to FIG. 8, an IC device assembly 800 includes components having one or more integrated circuit structures described herein. The IC device assembly 800 includes a number of components disposed on a circuit board 802 (which may be, e.g., a motherboard). The IC device assembly 800 includes components disposed on a first face 840 of the circuit board 802 and an opposing second face 842 of the circuit board 802. Generally, components may be disposed on one or both faces 840 and 842. In particular, any suitable ones of the components of the IC device assembly 800 may include a number of GaN channel-based MOS devices with a back barrier to increase breakdown voltage and to enable GaN C-MOS, such as disclosed herein.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. Although a single IC package 820 is shown in FIG. 8, multiple IC packages may be coupled to the interposer 804. It is to be appreciated that additional interposers may be coupled to the interposer 804. The interposer 804 may provide an intervening substrate used to bridge the circuit board 802 and the IC package 820. The IC package 820 may be or include, for example, a die (the die 702 of FIG. 7B), or any other suitable component. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804. In other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some implementations, the interposer 804 may be formed of alternate rigid or flexible materials that may include the same materials described above for use in a semiconductor substrate, such as silicon, germanium, and other group III-V and group IV materials. The interposer 804 may include metal interconnects 810 and vias 808, including but not limited to through-silicon vias (TSVs) 806. The interposer 804 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. The package-on-package structure 834 may be configured in accordance with any of the package-on-package structures known in the art.

Figure 9:
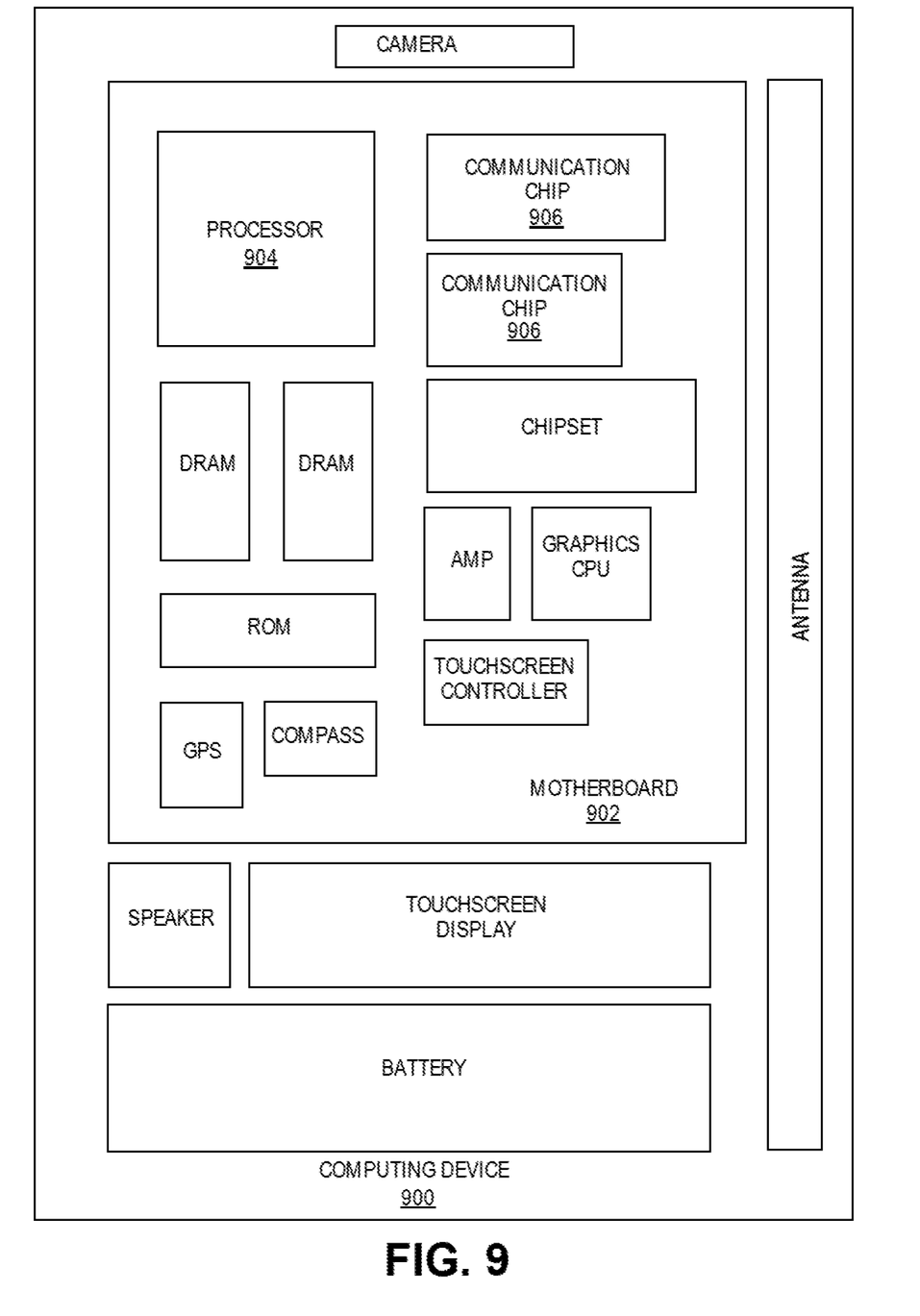
FIG. 9 illustrates a computing device in accordance with one implementation of the disclosure.

FIG. 9 illustrates a computing device 900 in accordance with one implementation of the disclosure. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the disclosure, the integrated circuit die of the processor includes one or more GaN channel-based MOS devices with a back barrier to increase breakdown voltage and to enable GaN C-MOS, in accordance with implementations of embodiments of the disclosure. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the disclosure, the integrated circuit die of the communication chip includes one or more GaN channel-based MOS devices with a back barrier to increase breakdown voltage and to enable GaN C-MOS, in accordance with implementations of embodiments of the disclosure.

In further implementations, another component housed within the computing device 900 may contain an integrated circuit die that includes one or more GaN channel-based MOS devices with a back barrier to increase breakdown voltage and to enable GaN C-MOS, in accordance with implementations of embodiments of the disclosure.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, embodiments described herein include GaN channel-based MOS devices with a back barrier to increase breakdown voltage and to enable GaN C-MOS.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a relaxed buffer stack that includes a channel region, wherein the relaxed buffer stack and the channel region include a group III-N semiconductor material, wherein the relaxed buffer stack comprises a plurality of AlGaN material layers and a buffer stack over the plurality of AlGaN material layers, wherein the buffer stack comprises the group III-N semiconductor material and has a thickness of less than approximately 25 nm. A back barrier is in the relaxed buffer stack between the plurality of AlGaN material layers and the buffer stack, wherein the back barrier comprises an AlGaN material of approximately 2-10% Al. A polarization stack over the relaxed buffer stack.

Example embodiment 2: The integrated circuit structure of embodiment 1, wherein the back barrier is approximately 0.75-1.25 um in thickness.

Example embodiment 3: The integrated circuit structure of embodiment 1, wherein the group III-N semiconductor material comprises GaN.

Example embodiment 4: The integrated circuit structure of embodiment 1, wherein the relaxed buffer stack further comprises a bottom material layer of aluminum and nitrogen, and the plurality of AlGaN material layers are over the bottom material layer.

Example embodiment 5: The integrated circuit structure of embodiment 1, wherein the plurality of AlGaN material layers each have a thickness less than approximately 250 nm and have a decreasing percentage of Al from a bottom one of the plurality of AlGaN material layers to a top one of the plurality of AlGaN material layers.

Example embodiment 6: The integrated circuit structure of embodiment 5, wherein the plurality of AlGaN material layers include a first AlGaN material layer on the bottom material layer, a second AlGaN material layer on the first AlGaN material layer, and a third AlGaN material layer on the second AlGaN material layer.

Example embodiment 7: The integrated circuit structure of embodiment 6, wherein the first AlGaN material layer comprises approximately 75% Al, the second AlGaN material layer comprises approximately 48% Al, and the third AlGaN material layer comprises approximately 25% Al.

Example embodiment 8: The integrated circuit structure of embodiment 6, wherein the first AlGaN material layer is approximately 75-125 nm in thickness, the second AlGaN material layer is approximately 175-225 nm in thickness, and the third AlGaN material layer is approximately 175-225 nm in thickness.

Example embodiment 9: The integrated circuit structure of embodiment 1, further comprising both an n-type device and a p-type device one the relaxed buffer stack, wherein the n-type device comprises the buffer stack on the relaxed buffer stack and the polarization stack on the buffer stack; and the p-type device comprises the buffer stack on the relaxed buffer stack.

Example embodiment 10: The integrated circuit structure of embodiment 9, wherein the n-type device includes a two-dimensional electron gas (2 DEG) configuration at an interface between an interlayer of the polarization stack and the buffer stack; and wherein the p-type device includes a two-dimensional hole gas (2DHG) configurations at an interface of the buffer stack and the back barrier.

Example embodiment 11: The integrated circuit structure of embodiment 9, wherein the channel region comprises one of an enhancement mode device and a depletion mode device.

Example embodiment 12: The integrated circuit structure of embodiment 1, further comprising a cap layer over the polarization stack.

Example embodiment 13: The integrated circuit structure of embodiment 12, wherein the cap layer comprises at least one of SiNx, SiO2, and BN.

Example embodiment 14: A transistor, comprises a relaxed buffer stack that includes a channel region, wherein the relaxed buffer stack and the channel region comprise GaN, wherein the relaxed buffer stack comprises: a bottom material layer, a plurality of AlGaN material layers over the bottom material layer, and a buffer stack over the plurality of AlGaN material layers, wherein the buffer stack comprises GaN and has a thickness of less than approximately 25 nm. A back barrier in the relaxed buffer stack between the plurality of AlGaN material layers and the buffer stack, wherein the back barrier comprises an AlGaN material of approximately 2-10% Al. A polarization stack is over the relaxed buffer stack. Source and drain regions are adjacent to the channel region.

Example embodiment 15: The transistor of embodiment 14, wherein the back barrier is approximately 0.75-1.25 um in thickness.

Example embodiment 16: The transistor of embodiment 14, wherein the plurality of AlGaN material layers each have a thickness less than approximately 250 nm and have a decreasing percentage of Al from a bottom one of the plurality of AlGaN material layers to a top one of the plurality of AlGaN material layers.

Example embodiment 17: The transistor of embodiment 16, wherein the plurality of AlGaN material layers include a first AlGaN material layer on the bottom material layer, a second AlGaN material layer on the first AlGaN material layer, and a third AlGaN material layer on the second AlGaN material layer, wherein the first AlGaN material layer comprises approximately 75% Al, the second AlGaN material layer comprises approximately 48% Al, and the third AlGaN material layer comprises approximately 25% Al.

Example embodiment 18: The transistor of embodiment 17, wherein the first AlGaN material layer is approximately 75-125 nm in thickness, the second AlGaN material layer is approximately 175-225 nm in thickness, and the third AlGaN material layer is approximately 175-225 nm in thickness.

Example embodiment 19: The transistor of embodiment 14, further comprising both an n-type device and a p-type device one the relaxed buffer stack, wherein the n-type device comprises the buffer stack on the relaxed buffer stack and the polarization stack on the buffer stack; and the p-type device comprises: the buffer stack on the relaxed buffer stack.

Example embodiment 20: The transistor of embodiment 19, wherein the n-type device includes a two-dimensional electron gas (2 DEG) configuration at an interface between an interlayer of the polarization stack and the buffer stack; and wherein the p-type device includes a two-dimensional hole gas (2DHG) configurations at an interface of the buffer stack and the back barrier.

Example embodiment 21: The transistor of embodiment 18, wherein the channel region comprises one of an enhancement mode device and a depletion mode device.

Example embodiment 22: The transistor of embodiment 14, further comprising a cap layer over the polarization stack.

Example embodiment 23: The transistor of embodiment 22, wherein the cap layer comprises at least one of SiNx, SiO2, and BN.

Example embodiment 24: A method of fabricating transistor layers, the method comprising: forming a relaxed buffer stack that includes a channel region, wherein the relaxed buffer stack and the channel region include a group III-N semiconductor material, wherein the relaxed buffer stack comprises a plurality of AlGaN material layers and a buffer stack over the plurality of AlGaN material layers, wherein the buffer stack comprises the group III-N semiconductor material and has a thickness of less than approximately 25 nm; forming a back barrier in the relaxed buffer stack between the plurality of AlGaN material layers and the buffer stack, wherein the back barrier comprises an AlGaN material of approximately 2-10% Al; and forming a polarization stack over the relaxed buffer stack.

Example embodiment 25: The method of claim 24, further comprising: using the relaxed buffer stack having the back barrier to fabricate p-type devices to provide integrated CMOS circuitry by: after the polarization stack is formed over the buffer stack, etching the polarization stack and the buffer stack down to the back barrier to form source/drain trenches that form a plurality of device stacks that define both n-type device locations and p-type device locations; forming n-type devices on or around the plurality of device stacks in the n-type device locations, where the n-type devices include a 2 DEG configuration; etching the polarization stack from the plurality of device stacks in the p-type device locations, and forming 2DHG configurations at the interface of the buffer stack and the back barrier to acts as a polarization layer for the back barrier.

What is claimed is:

1. An integrated circuit structure, comprising:
   a relaxed buffer stack that includes a channel region, wherein the relaxed buffer stack and the channel region include a group III-N semiconductor material, wherein the relaxed buffer stack comprises a plurality of AlGaN material layers and a buffer stack over the plurality of AlGaN material layers, wherein the buffer stack comprises the group III-N semiconductor material and has a thickness of less than approximately 25 nm;
   a back barrier in the relaxed buffer stack between the plurality of AlGaN material layers and the buffer stack, wherein the back barrier comprises an AlGaN material of approximately 2-10% Al; and
   a polarization stack over the relaxed buffer stack.

2. The integrated circuit structure of claim 1, wherein the back barrier is approximately 0.75-1.25 μm in thickness.

3. The integrated circuit structure of claim 1, wherein the group III-N semiconductor material comprises GaN.

4. The integrated circuit structure of claim 1, wherein the relaxed buffer stack further comprises a bottom material layer of aluminum and nitrogen, and the plurality of AlGaN material layers are over the bottom material layer.

5. The integrated circuit structure of claim 1, wherein the plurality of AlGaN material layers each have a thickness less than approximately 250 nm and have a decreasing percentage of Al from a bottom one of the plurality of AlGaN material layers to a top one of the plurality of AlGaN material layers.

6. The integrated circuit structure of claim 5, wherein the plurality of AlGaN material layers include a first AlGaN material layer on the bottom material layer, a second AlGaN material layer on the first AlGaN material layer, and a third AlGaN material layer on the second AlGaN material layer.

7. The integrated circuit structure of claim 6, wherein the first AlGaN material layer comprises approximately 75% Al, the second AlGaN material layer comprises approximately 48% Al, and the third AlGaN material layer comprises approximately 25% Al.

8. The integrated circuit structure of claim 6, wherein the first AlGaN material layer is approximately 75-125 nm in thickness, the second AlGaN material layer is approximately 175-225 nm in thickness, and the third AlGaN material layer is approximately 175-225 nm in thickness.

9. The integrated circuit structure of claim 1, further comprising both an n-type device and a p-type device one-on the relaxed buffer stack, wherein the n-type device comprises the buffer stack on the relaxed buffer stack and the polarization stack on the buffer stack; and the p-type device comprises the buffer stack on the relaxed buffer stack.

10. The integrated circuit structure of claim 9, wherein the n-type device includes a two-dimensional electron gas (2 DEG) configuration at an interface between an interlayer of the polarization stack and the buffer stack; and wherein the p-type device includes a two-dimensional hole gas (2DHG) configuration at an interface of the buffer stack and the back barrier.

11. The integrated circuit structure of claim 1, wherein the channel region comprises one of an enhancement mode device and a depletion mode device.

12. The integrated circuit structure of claim 1, further comprising a cap layer over the polarization stack.

13. The integrated circuit structure of claim 12, wherein the cap layer comprises at least one of SiNx, $SiO_2$, and BN.

14. A transistor, comprising:
   a relaxed buffer stack that includes a channel region, wherein the relaxed buffer stack and the channel region comprise GaN, wherein the relaxed buffer stack comprises: a bottom material layer, a plurality of AlGaN material layers over the bottom material layer, and a buffer stack over the plurality of AlGaN material layers, wherein the buffer stack comprises GaN and has a thickness of less than approximately 25 nm;
   a back barrier in the relaxed buffer stack between the plurality of AlGaN material layers and the buffer stack, wherein the back barrier comprises an AlGaN material of approximately 2-10% Al;
   a polarization stack over the relaxed buffer stack; and
   source and drain regions adjacent to the channel region.

15. The transistor of claim 14, wherein the back barrier is approximately 0.75-1.25 μm in thickness.

16. The transistor of claim 14, wherein the plurality of AlGaN material layers each have a thickness less than approximately 250 nm and have a decreasing percentage of Al from a bottom one of the plurality of AlGaN material layers to a top one of the plurality of AlGaN material layers.

17. The transistor of claim 16, wherein the plurality of AlGaN material layers include a first AlGaN material layer on the bottom material layer, a second AlGaN material layer on the first AlGaN material layer, and a third AlGaN material layer on the second AlGaN material layer, wherein the first AlGaN material layer comprises approximately 75% Al, the second AlGaN material layer comprises approximately 48% Al, and the third AlGaN material layer comprises approximately 25% Al.

18. The transistor of claim 17, wherein the first AlGaN material layer is approximately 75-125 nm in thickness, the second AlGaN material layer is approximately 175-225 nm in thickness, and the third AlGaN material layer is approximately 175-225 nm in thickness.

19. The transistor of claim 14, further comprising both an n-type device and a p-type device one on the relaxed buffer stack, wherein the n-type device comprises the buffer stack on the relaxed buffer stack and the polarization stack on the buffer stack; and the p-type device comprises the buffer stack on the relaxed buffer stack.

20. The transistor of claim 19, wherein the n-type device includes a two-dimensional electron gas (2 DEG) configuration at an interface between an interlayer of the polarization stack and the buffer stack; and wherein the p-type device includes a two-dimensional hole gas (2DHG) configuration at an interface of the buffer stack and the back barrier.

21. The transistor of claim 14, wherein the channel region comprises one of an enhancement mode device and a depletion mode device.

22. The transistor of claim 14, further comprising a cap layer over the polarization stack.

23. The transistor of claim 22, wherein the cap layer comprises at least one of SiNx, $SiO_2$, and BN.

* * * * *